(12) United States Patent
Guilar et al.

(10) Patent No.: US 12,231,126 B1
(45) Date of Patent: Feb. 18, 2025

(54) SYSTEM AND METHOD FOR GENERATING SAMPLING STROBE FOR SAMPLING AN INPUT SIGNAL

(71) Applicant: Keysight Technologies, Inc., Santa Rosa, CA (US)

(72) Inventors: Nathaniel Guilar, San Carlos, CA (US); John Patrick Keane, San Jose, CA (US); Robert Neff, Palo Alto, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 11 days.

(21) Appl. No.: 18/127,771

(22) Filed: Mar. 29, 2023

(51) Int. Cl.
*H03K 5/01* (2006.01)
*G06F 1/08* (2006.01)
*H03L 7/081* (2006.01)
*H03K 5/00* (2006.01)

(52) U.S. Cl.
CPC .......... *H03K 5/01* (2013.01); *G06F 1/08* (2013.01); *H03L 7/0812* (2013.01); *H03K 2005/00078* (2013.01); *H03K 2005/00286* (2013.01)

(58) Field of Classification Search
None
See application file for complete search history.

(56) References Cited

U.S. PATENT DOCUMENTS

| | | | |
|---|---|---|---|
| 7,844,021 B2 * | 11/2010 | Gibbons | H04L 7/033 375/371 |
| 8,487,795 B1 | 7/2013 | Jiang et al. | |
| 8,902,094 B1 | 12/2014 | Zhang et al. | |
| 9,118,316 B2 | 8/2015 | Vandel | |
| 9,503,115 B1 | 11/2016 | Shin et al. | |
| 2009/0103675 A1* | 4/2009 | Yousefi Moghaddam | H03L 7/10 375/376 |
| 2010/0253414 A1 | 10/2010 | Dedic et al. | |

FOREIGN PATENT DOCUMENTS

| | | |
|---|---|---|
| EP | 2849022 A1 | 3/2015 |
| EP | 3217543 A1 | 9/2017 |

OTHER PUBLICATIONS

Jianwen Li et al., "A 3GSps 12-bit Four-Channel Time-InterleavedPipelined ADC in 40 nm CMOS Process", Electronics 2019, 8, 1551, pp. 1-16.
Ken Rush et al., "A 4GHz 8b Data Acquisition System," 1991 IEEE International Solid-State Circuits Conference, pp. 1-3.

* cited by examiner

*Primary Examiner* — Cassandra F Cox

(57) ABSTRACT

A device for generating a sampling strobe, which controls a sampling device to sample an input signal, includes a phase shifter configured to phase shift an input clock to provide multiple phase shifted input clock signals; and aperture generating circuits configured to generate sampling clock signals from the phase shifted input clock signals, respectively, by adjusting duty cycles of the phase shifted input clock signals to provide sampling pulses having desired pulse widths, where for each sampling clock signal of the sampling clock signals, a rising edge and a falling edge of each sampling pulse originate from the same input edge of the input clock; and apply the sampling clock signals to interleaved samplers of the sampling device, respectively, for controlling sampling of the input signal by integrating according to the desired pulse widths of the sampling pulses, where the desired pulse widths correspond to sampling apertures.

20 Claims, 7 Drawing Sheets

SYSTEM AND METHOD FOR GENERATING SAMPLING STROBE FOR SAMPLING AN INPUT SIGNAL

BACKGROUND

Mixed signal electrical systems typically require precision clocks. It may be beneficial for the precision input clocks to have non-50 percent duty cycles, which generally allow for more interleaving of multiple channels (slices) to increase throughput. Conventional techniques for providing precision input clocks correlate between neighboring edges of the input clock signals, which results in modulation of pulse widths. This pulse width modulation results in unwanted noise or uncertainty, mostly caused by uncorrelated jitter.

For example, a high speed analog to digital converter (ADC) performs time-interleaved analog to digital conversion by effectively operating multiple ADCs in parallel, where each ADC samples a portion of the an analog input signal. Coordinated sampling operation of the multiple ADCs is controlled by sampling clock signals from a common precision input clock, where the sampling signals have non-50 percent duty cycles. However, sampling apertures of the ADCs are frequently generated from pulses of the sampling clock signals that have edges originating from different input edges of the input clock. This results in undesirable levels of aperture jitter and centroid jitter with regard to the sampling apertures.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
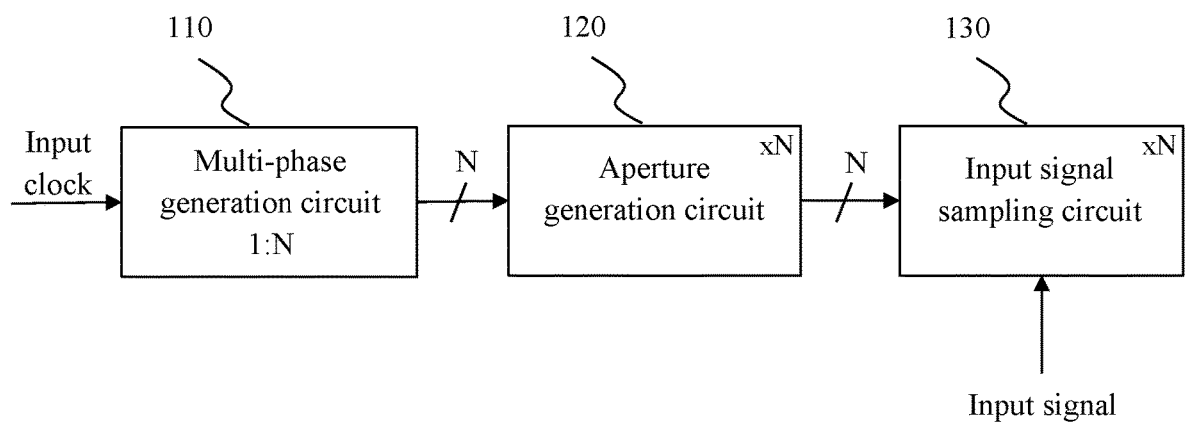
FIG. 1 is a simplified block diagram illustrating a system for generating a sampling strobe for sampling an input signal, according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

As used in the specification and appended claims, and in addition to their ordinary meanings, the terms "substantial" or "substantially" mean to within acceptable limits or degree. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

The various embodiments described herein provide multiple, time interleaved samplers that function on the same input signal with less susceptibility to input clock jitter causing the sampling pulse width modulation. This reduces susceptibly (or transfer function) from input clock jitter to aperture width variation by a factor of the square root of 2 or 3 dB, as compared to conventional techniques. Also, the aperture pulse width is defined by local delay and not external clock duty cycle.

According to a representative embodiment, a method is provided for generating a sampling strobe for sampling an input signal. The method includes generating a multi-phase clock signal from an input clock, where the multi-phase clock signal includes multiple phase shifted input clock signals; generating multiple sampling clock signals from the multiple phase shifted input clock signals by adjusting duty cycles of the multiple phase shifted input clock signals, respectively, to provide sampling pulses having desired pulse widths, where for each sampling clock signal, a rising edge and a falling edge of each sampling pulse originate from the same input edge of the input clock; and applying the multiple sampling clock signals to multiple interleaved samplers, respectively, for controlling sampling of the input signal according to the desired pulse widths of the sample pulses, where the desired pulse widths correspond to sampling apertures.

According to a representative embodiment, a device is provided for generating a sampling strobe for controlling a sampling device to sample an input signal. The device includes a phase shifter configured to phase shift an input clock to provide a multi-phase clock signal comprising multiple phase shifted input clock signals; and an aperture generating circuit configured to generate multiple sampling clock signals from the phase shifted input clock signals, respectively, by adjusting duty cycles of the phase shifted input clock signals to provide sampling pulses having desired pulse widths, where for each sampling clock signal of the multiple sampling clock signals, a rising edge and a falling edge of each sampling pulse originate from the same input edge of the input clock; and apply the sampling clock signals to multiple interleaved samplers of the sampling device, respectively, for controlling sampling of the input signal by integrating according to the desired pulse widths of the sample pulses, where the desired pulse widths correspond to sampling apertures.

According to a representative embodiment, a device is provided for generating a sampling strobe for controlling a sampling device to sample an input signal. The device includes a phase shifter configured to phase shift an input clock to provide a multi-phase clock signal including multiple phase shifted input clock signals; and a multiple aperture generating paths configured to generate multiple sampling clock signals from the multiple phase shifted input clock signals, respectively, to be applied to multiple interleaved samplers of an input signal sampling circuit for controlling sampling of the input signal. Each aperture generating path includes a splitter configured to split the respective phase shifted input clock signal into split input clock signals; and a path delay circuit configured to delay and invert one of the split input clock signals by a path delay, thereby providing a delayed and inverted split input clock signal in addition to a non-delayed split input clock signal. The multiple interleaved samplers include multiple switch pairs connected in parallel for receiving the input signal, and each switch pair includes a first switch connected in series with a second switch. The first switch of each switch pair is controlled by the non-delayed split input clock signal from a corresponding aperture generating path, and the second switch of each switch pair is controlled by the delayed and inverted split input clock signal from the corresponding aperture generating path. For each interleaved sampler, a sampling aperture for the sampling of the input signal is defined as a duration of when both the first switch and the second switch are on in response to the non-delayed and delayed split input clock signals, such that a start and a stop of each sampling aperture originate from the same input edge of the phase shifted input clock signal, and the duration of when both the first switch and the second switch are on is equal to the path delay.

FIG. 1 is a simplified block diagram illustrating a system for sampling an input signal, according to a representative embodiment.

Referring to FIG. 1, sampling system 100 includes a multi-phase generation circuit (phase shifter) 110, an aperture generation circuit 120, and an input signal sampling circuit 130. The multi-phase generation circuit 110, or phase shifter, is configured to receive an input clock from a system clock (not shown), and to phase shift the input clock to provide a multi-phase clock signal. The multi-phase generation circuit 110 may be implemented using any compatible phase shifter, such as one or more time delay circuits, dividers, phase locked oscillators with multiple output phases, or the like. The multi-phase clock signal includes multiple (N) phase shifted input clock signals, where N is a positive integer. For example, when there are four phase shifted input clock signals (N=4), the multi-phase generation circuit 110 outputs a multi-phase clock signal having phases of 0 degrees, 90 degrees, 180 degrees, and 270 degrees. In an embodiment, the system clock may be a differential clock, for example, configured to provide a positive input clock (P) and a negative input clock (N) for phase shifting, although non-differential system clocks may be incorporated without departing from the scope of the present teachings.

The aperture generation circuit 120 is configured to receive the multi-phase clock signal from the multi-phase generation circuit 110, and to adjust the duty cycle of each of the phase shifted input clock signals to provide a sampling strobe comprising sampling clock signals. That is, the aperture generation circuit 120 generates multiple (N) sampling clock signals from the phase shifted input clock signals, respectively, by adjusting the duty cycles of the phase shifted input clock signals. Each of the sampling clock signals is generated to include sampling pulses, where a rising edge and a falling edge of each sampling pulse originates from the same input edge of the input clock. The pulse width between the rising and falling edges of the sampling pulse defines the sampling aperture during which the sampling system 100 samples the input signal. The aperture generation circuit 120 may be implemented using logic gates and time delay circuits, for example, to control the pulse widths of the sampling pulses of the sampling clock signals, respectively, as discussed below.

The input signal sampling circuit 130 is an input signal de-multiplexer and integrator, and includes multiple, interleaved samplers for selectively sampling the input signal under control of the sampling clock signals. The interleaved samplers are configured to receive the sampling clock signals from the aperture generation circuit 120, respectively, and to activate in response to the sample pulses to perform sampling of the input signal for a time corresponding to the pulse width. When activated, the interleaved samplers integrate the input signal. For example, when the input signal is a current signal, the interleaved samplers collect the current during the time corresponding to the pulse width to provide the sampled input signal. The input signal sampling circuit 130 may be implemented using switches that are selectively activated in response to the sampling clock signals and integrators that collect a current input signal over time, while the corresponding switches are activated (during the sampling pulses) to collect sampling voltages. The input signal sampling circuit 130 may be included with an analog to digital converter (ADC), for example, which samples an analog input signal for digitizing.

Figure 2:
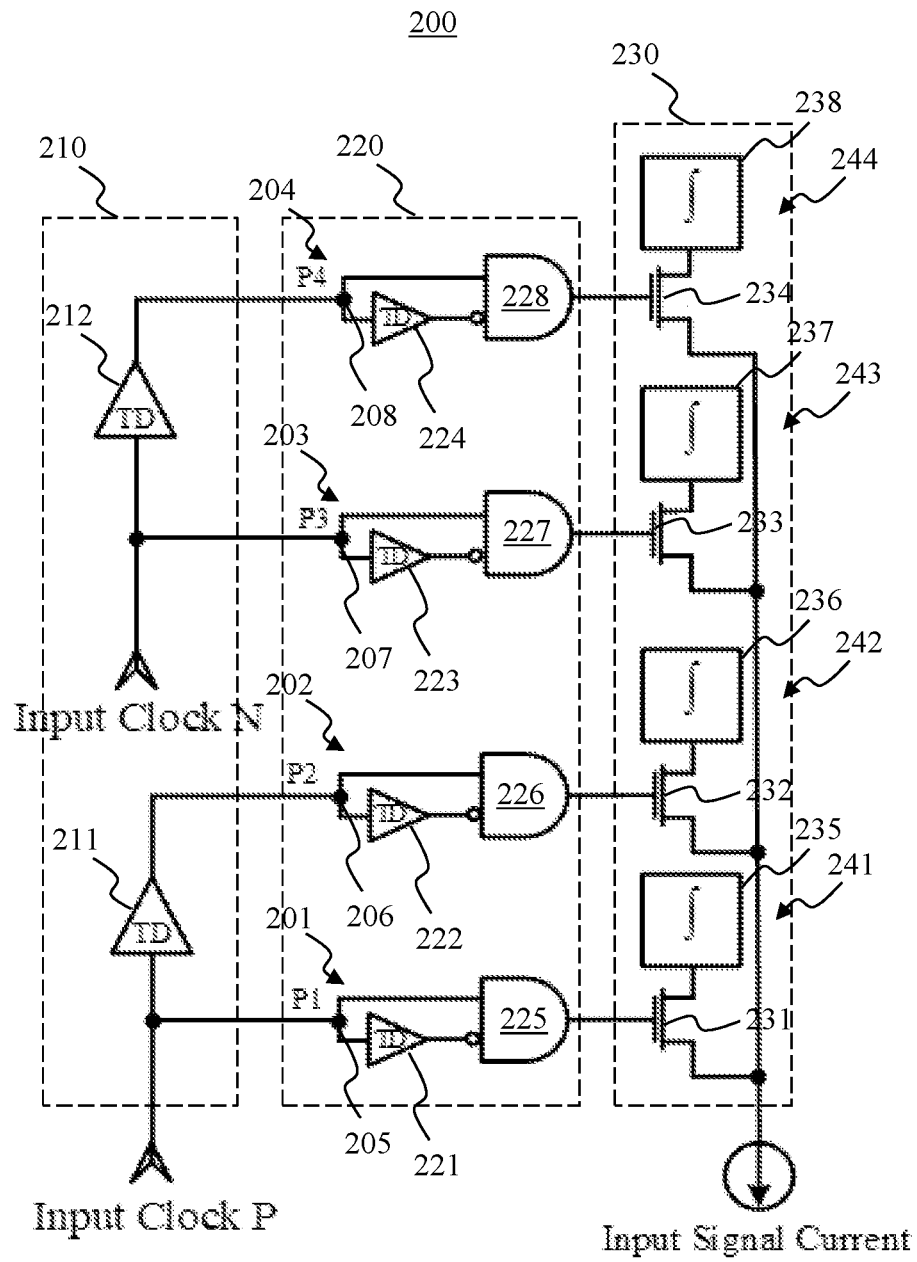
FIG. 2 is a simplified circuit diagram illustrating a system for generating a sampling strobe for sampling an input signal, the system having a multi-phase generation circuit that includes time delay circuits, according to a representative embodiment.

FIG. 2 is a simplified circuit diagram illustrating a system for generating a sampling strobe for sampling an input signal, the system having a multi-phase generation circuit that includes time delay circuits, according to a representative embodiment.

Referring to FIG. 2, sampling system 200 includes a multi-phase generation circuit (phase shifter) 210 and an aperture generation circuit 220, where the multi-phase generation circuit 210 provides a multi-phase clock signal including phase shifted input clock signals to the aperture generation circuit 220. In response to the phase shifted input clock signals, the aperture generation circuit 220 generates a sampling strobe that controls input signal sampling circuit 230, where the sampling strobe includes multiple sampling clock signals.

In the depicted embodiment, the multi-phase generation circuit 210 includes a first time delay circuit 211 and a second time delay circuit 212. In the depicted embodiment, the input clock is a differential input clock. Therefore, the first time delay circuit 211 receives a positive input clock and the second time delay circuit 212 receives a negative input clock, which is delayed from the positive input clock by 180 degrees. When the input clock is not differential, one or more additional time delay circuits would be required to provide the different phases. The first and second time delay circuits 211 and 212 may be implemented separately, or may be part of the same delay lock loop (DLL), for example. The first and second time delay circuits 211 and 212 may be delay lines, phase interpolators, closed loop delay cells, or injection locked oscillators with multiple output phases, for example.

The first time delay circuit 211 is configured to delay the positive input clock by a phase delay to output a delayed positive input clock signal that is phase shifted by 90 degrees from the positive input clock. The second time delay circuit 212 is configured to delay the negative input clock by the phase delay to output a delayed negative input clock signal that is phase shifted by 90 degrees from the negative input clock. The multi-phase generation circuit 210 therefore outputs four phase shifted input clock signals P1, P2, P3 and P4 at 90 degree intervals. That is, the phase shifted input clock signal P1 has a phase of 0 degrees, the phase shifted input clock signal P2 has a phase of 90 degrees, the phase shifted input clock signal P3 has a phase of 180 degrees, and the phase shifted input clock signal P4 has a phase of 270 degrees. Of course, the multi-phase generation circuit 210 may be configured to output more or fewer phase shifted input clock signals to provide unique benefits for any particular situation or to meet application specific design requirements of various implementations, without departing from the scope of the present teachings.

In the depicted embodiment, the aperture generation circuit 220 includes four aperture generation paths that receive the four phase shifted input clock signals P1, P2, P3 and P4, respectively, and output corresponding sampling clock signals in response, which make up the sampling strobe. Each of the aperture generation paths includes a signal splitter, a path delay circuit, and a logic gate. In particular, a first aperture generation path 201 includes a first splitter 205, a first path delay circuit 221 and a first logic gate 225, a second aperture generation path 202 includes a second splitter 206, a second path delay circuit 222 and a second logic gate 226, a third aperture generation path 203 includes a third splitter 207, a third path delay circuit 223 and a third logic gate 227, and a fourth aperture generation path 204 includes a fourth splitter 208, a fourth path delay circuit 224 and a fourth logic gate 228.

Each of the first through fourth splitters 205-208 splits a corresponding one of the phase shifted input clock signals P1-P4. Each of the first through fourth path delay circuits 221-224 is configured to delay one of the split input clock signals of the corresponding phase shifted input clock signal P1-P4 by a path delay amount to provide an undelayed split input clock signal and a delayed split input clock signal. The length (time period) of the path delay is set equal to a desired sampling aperture of a corresponding one of the interleaved samplers, discussed below. The first through fourth path delay circuits 221-224 may be implemented by any compatible time delay circuit, such as an active buffer delay, a passive filter, an open loop delay cell, or a transmission line delay, for example.

Each of the first through fourth logic gates 225-228 is configured to input undelayed and delayed split input clock signals from a corresponding one of the phase shifted input clock signals P1-P4, and to output a sampling pulse of a sampling clock signal only during the time period between receiving an edge of the undelayed split input clock signal and receiving the same edge of the delayed split input clock signal. In this manner, the rising and falling edges of each sampling pulse of the sampling clock signal originate from the same input edge of the input clock, and has a desired pulse width equal to the length of the path delay. The delayed split input clock signal is provided by the first through fourth path delay circuits 221-224, respectively, so the desired pulse width is the same as the desired sampling aperture the interleaved samplers.

In the depicted embodiment, each of the first through fourth logic gates 225-228 is an AND logic gate with an inverted input for receiving the delayed split input clock signal. Accordingly, the output of the AND logic gate is high (1) only when the undelayed input is high (1) and the delayed input is low (0). Of course, other types of logic gates configured to output the same pattern of logic levels, or an inverse of the same pattern, may be implemented without departing from the scope of the present teachings.

Figure 3:
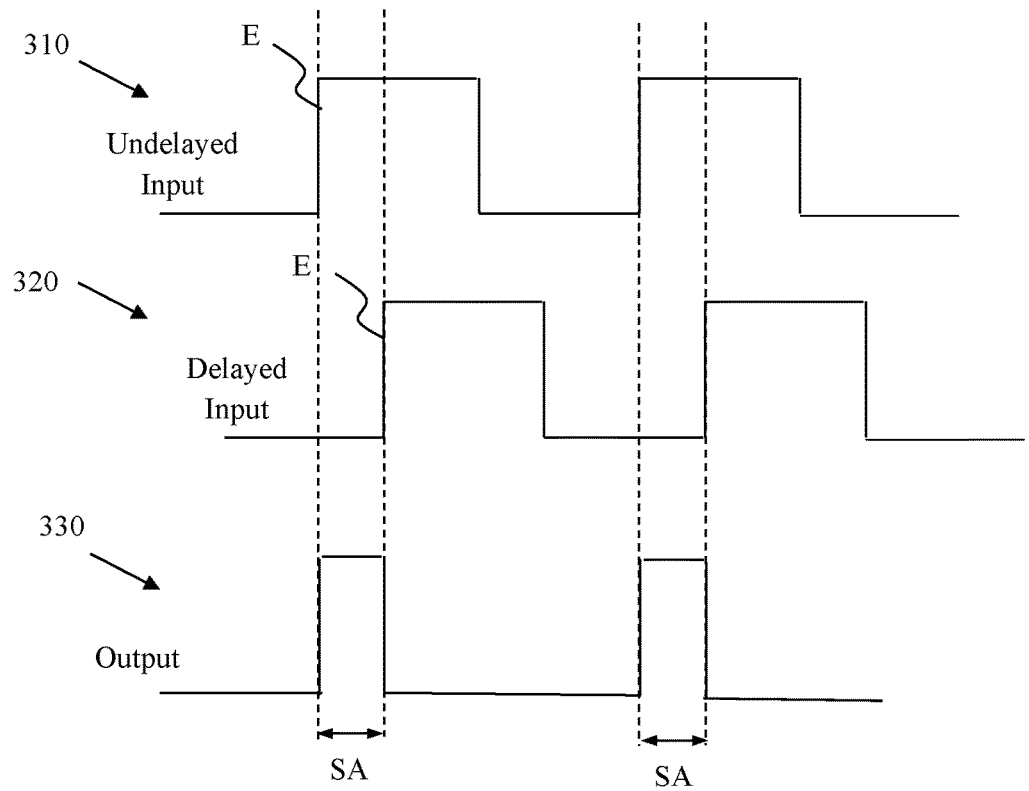
FIG. 3 is a logic diagram showing inputs and an output of a logic gate in an aperture generation circuit, according to a representative embodiment.

FIG. 3 is a logic diagram showing voltage levels of the inputs and output of the first logic gate 225, for example, according to a representative embodiment. Referring to FIG. 3, the waveform 310 shows the undelayed split input clock signal provided to the non-inverted input of the first logic gate 225, and the waveform 320 shows the delayed split input clock signal (output by the first path delay circuit 221) provided to the inverted input of the first logic gate 225. The waveform 330 shows the output by the first logic gate 225 in response to the non-inverted and inverted inputs.

As shown, an edge E of the delayed split input clock signal is delayed from the same edge E of the undelayed split input clock signal by the desired sampling aperture SA, where the edge E in both the delayed and undelayed split clock signals are derived from the same input edge of the input clock. During this delay time, when the non-inverted input of the first logic gate 225 is high and the inverted input of the first logic gate 225 is low, the output of the first logic gate 225 is also high, thereby providing a sampling pulse having a pulse width equal to the sampling aperture SA. The second through fourth logic gates 226-228 function in the same manner.

Referring again to FIG. 2, the input signal sampling circuit 230 includes four interleaved samplers that receive the sampling clock signals output by the first through fourth logic gates 225-228, respectively. The sampling clock signals control sampling of the input signal by the interleaved samplers connected in parallel, where the input signal is a current signal in the depicted embodiment. Each of the interleaved samplers includes a switch and an integrator configured to integrate the input signal over the duration of each sampling aperture, under control of the switch, to capture a corresponding sampling voltage. In particular, a first interleaved sampler 241 includes a first switch 231 and a first integrator 235, a second interleaved sampler 242 includes a second switch 232 and a second integrator 236, a third interleaved sampler 243 includes a third switch 233 and a third integrator 237, and a fourth interleaved sampler 244 includes a fourth switch 234 and a fourth integrator 238. Each of the first through fourth switches 231-234 is configured to activate (turn on) during the sampling pulses of the sampling clock signals from the first through forth logic gates 226-228, respectively, and to deactivate (turn off) between the sampling pulses. When the first through fourth switches 231-234 are activated, the first through fourth integrators 235-238 collect and integrate current from the input signal to integrate sampled voltages, respectively. In this manner, the first through fourth integrators 235-238 integrate the input signal only during the sampling apertures corresponding to the sampling pulses controlling the first through fourth switches 231-234.

The first through fourth switches 231-234 may be transistors, for example, such as field effect transistors (FETs) (as shown) or bipolar junction transistors (BJTs), for example. When the first through fourth switches 231-234 are FETs, the gates are connected to the first through fourth aperture generation paths 201-204 to receive the sampling clock signals for turning the FETs on and off, respectively, while the drains may be connected to the first through fourth integrators 235-238 and the sources may be connected to the input signal source such that samples of the input signal are integrated by the first through fourth integrators 235-238 when the FETs are selectively turned on. When the first through fourth switches 231-234 are BJTs, the bases are connected to the first through fourth aperture generation paths 201-204 to receive the sampling clock signals for turning the BJTs on and off, respectively, while the emitters may be connected to the first through fourth integrators 235-238 and the collectors may be connected to the input signal source such that samples of the input signal are integrated by the first through fourth integrators 235-238 when the BJTs are selectively turned on. Of course, the other types of compatible switches may be incorporated without departing from the scope of the present teachings.

The first through fourth integrators 235-238 may be capacitors, or capacitors connected in parallel with resistors, for example, for collecting the current input signal during the sampling pulses to provide corresponding voltages. Of course, the other types of compatible integrators may be incorporated without departing from the scope of the present teachings.

Figure 4:
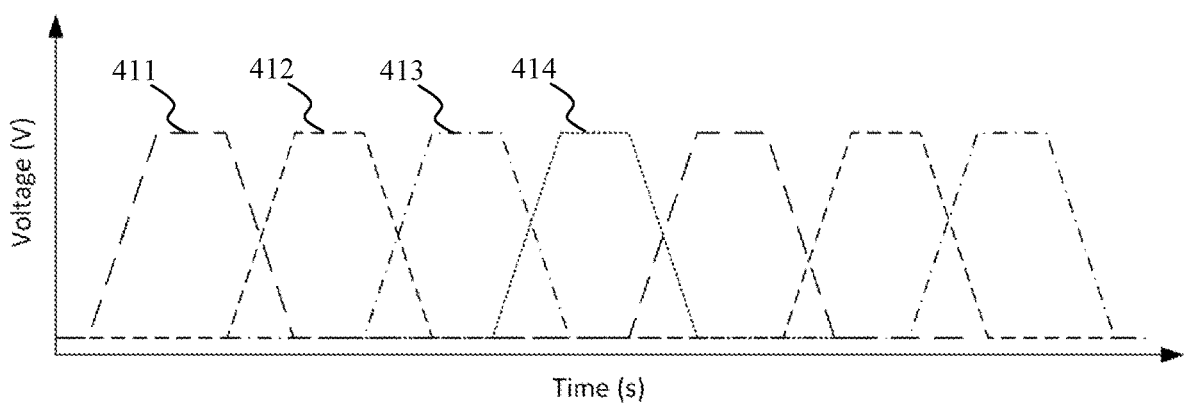
FIG. 4 is an example time domain waveform of a sampling strobe, including the four sampling waveforms output by the aperture generation circuit, according to a representative embodiment.

FIG. 4 is an example time domain waveform of a sampling strobe, including the four sampling waveforms output by the aperture generation circuit 220, according to a representative embodiment. Referring to FIG. 4, the waveform 410 includes sampling waveforms 411, 412, 413, and 414 output by the first through fourth aperture generation paths 201-204, respectively. The time delay implemented by each of the first and second time delay circuits 211 and 212 has been selected to be one quarter of the input clock period (TS) of the input clock, and the sampling edges of the sampling pulses are equally spaced in time. The time delay implemented by each of the first through fourth path delay circuits 221-224 has also been selected to be approximately one quarter of the input clock period (TS) of the input clock. Therefore, the time delay implemented by each of the first and second time delay circuits 211 and 212 is approximately equal to the time delay implemented by each of the first through fourth path delay circuits 221-224. In this case, the pulse widths of the sampling pulses provided by the first through fourth aperture generation paths 201-204 are approximately equal to the phase shifts of the phase shifted input clock signals in the multi-phase clock signal. Approximately refers to no more than a 10 percent differential.

In alternative embodiments, the time delay implemented by each of the first and second time delay circuits 211 and 212 may differ from the time delay implemented by each of the first through fourth path delay circuits 221-224, in which case the sampling pulses from the first through fourth path delay circuits 221-224 do not abut one another as shown in FIG. 4. For example, when the time delay of the first and second time delay circuits 211 and 212 is greater than the time delay of the first through fourth path delay circuits 221-224, the sampling pulses are spaced apart from one another, and when the time delay of the first and second time delay circuits 211 and 212 is less than the time delay of the first through fourth path delay circuits 221-224, the sampling pulses overlap one another.

Figure 5:
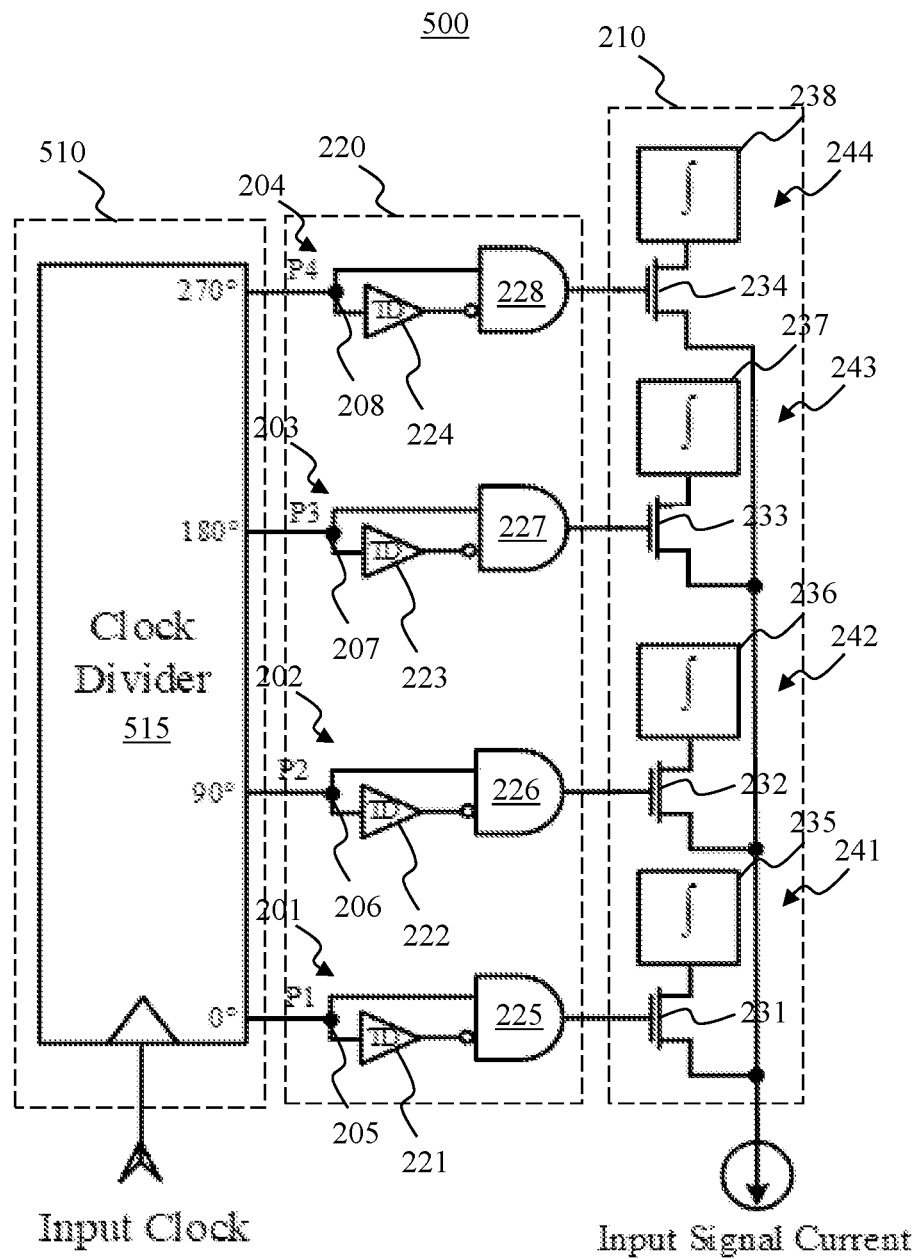
FIG. 5 is a simplified circuit diagram illustrating a system for generating a sampling strobe for sampling an input signal, the system having a multi-phase generation circuit that includes a clock divider, according to a representative embodiment.

FIG. 5 is a simplified circuit diagram illustrating a system for generating a sampling strobe for sampling an input signal, the system having a multi-phase generation circuit that includes a clock divider, according to a representative embodiment.

Referring to FIG. 5, sampling system 500 includes a multi-phase generation circuit (phase shifter) 510 and aperture generation circuit 220, where the multi-phase generation circuit 510 provides a multi-phase clock signal including phase shifted input clock signals to the aperture generation circuit 220. In response to the phase shifted input clock signals, the aperture generation circuit 220 generates a sampling strobe that controls input signal sampling circuit 230, where the sampling strobe includes multiple sampling clock signals. The aperture generation circuit 220 and the input signal sampling circuit 230 are the same as discussed above, and therefore the descriptions will not be repeated.

In the depicted embodiment, the multi-phase generation circuit 510 includes a clock divider 515 configured to divide down the input clock from a higher frequency of the input clock to provide the phase shifted input clock signals having different phases. For example, the input clock would have to be twice the frequency as the input clock in FIG. 2. The phase shifted input clock signals output by the multi-phase generation circuit 510 have a lower frequency than the input clock due to the dividing operation. The clock divider 515 outputs four phase shifted input clock signals P1, P2, P3 and P4 at 90 degree intervals. That is, the phase shifted input clock signal P1 has a phase of 0 degrees, the phase shifted input clock signal P2 has a phase of 90 degrees, the phase shifted input clock signal P3 has a phase of 180 degrees, and the phase shifted input clock signal P4 has a phase of 270 degrees. Of course, the multi-phase generation circuit 510 may be configured output more or fewer phase shifted input clock signals to provide unique benefits for any particular situation or to meet application specific design requirements of various implementations, without departing from the scope of the present teachings. Also, as discussed above with regard to FIG. 2, the pulse widths of the sampling pulses provided by the first through fourth aperture generation paths 201-204 are approximately equal to the phase shifts of the phase shifted input clock signals in the multi-phase clock signal output by the multi-phase generation circuit 510.

Figure 6:
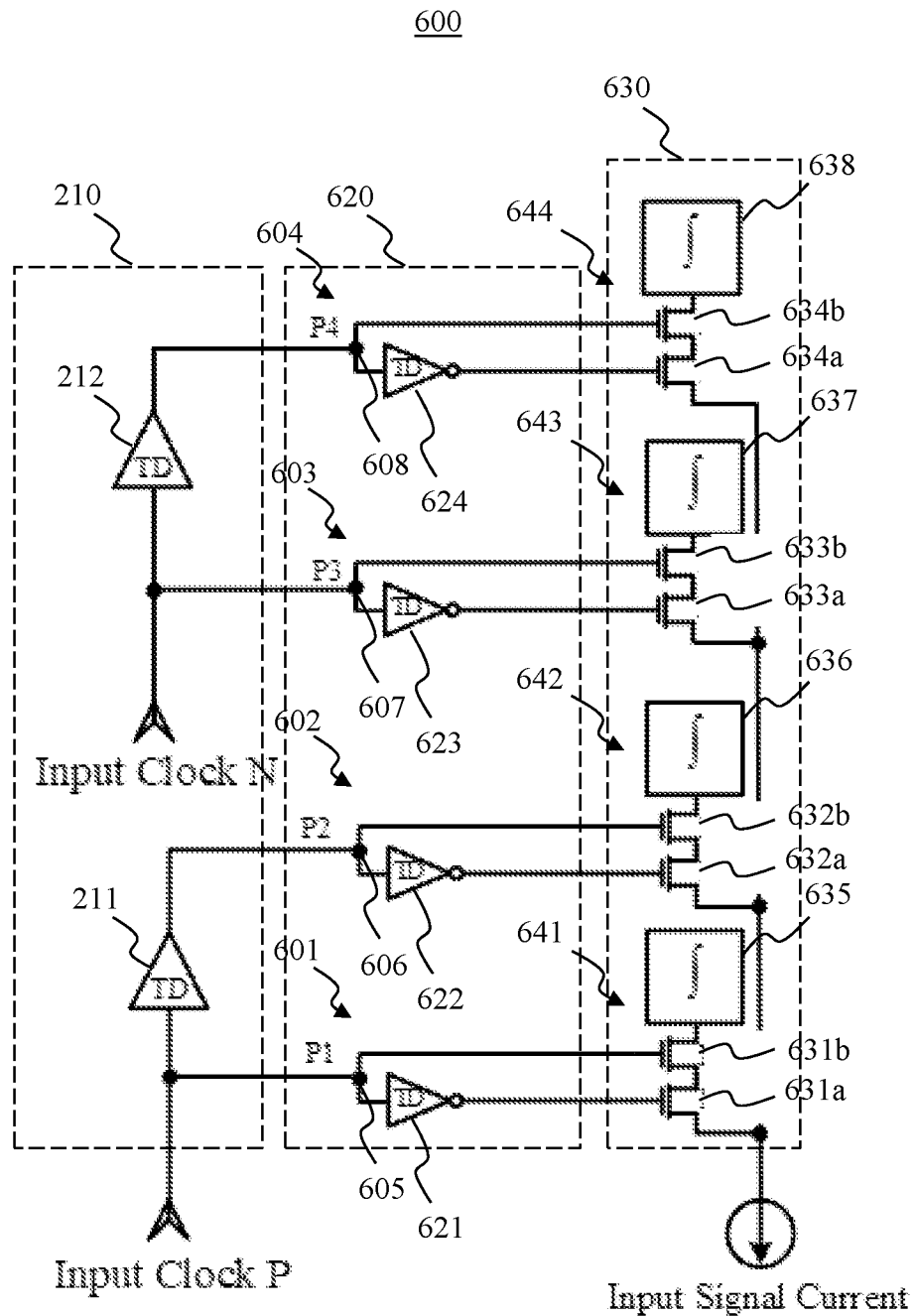
FIG. 6 is a simplified block diagram illustrating a system for generating a sampling strobe for sampling an input signal without logic gates, according to a representative embodiment.

FIG. 6 is a simplified block diagram illustrating a system for sampling an input signal without logic gates, according to a representative embodiment.

Referring to FIG. 6, sampling system 600 includes multi-phase generation circuit 210 and aperture generation circuit 620, where the multi-phase generation circuit 210 provides a multi-phase clock signal including phase shifted input clock signals to the aperture generation circuit 620. The sampling system 600 may be implemented alternatively using a clock divider, such as clock divider 515 discussed above with reference to FIG. 5, as the multi-phase generation circuit in place of the as the multi-phase generation circuit 210. The clock divider is configured to divide down the input clock from a higher frequency of the input clock to provide the phase shifted input clock signals having different phases. In response to the phase shifted input clock signals, the aperture generation circuit 620 generates a sampling strobe that controls input signal sampling circuit 630, where the sampling strobe includes multiple sampling clock signals. The multi-phase generation circuit 210 is the same as discussed above, and therefore the description will not be repeated. Alternatively, the multi-phase clock signal may be provided by the multi-phase generation circuit 510, without departing from the scope of the present teachings.

In the depicted embodiment, the aperture generation circuit 620 includes four aperture generation paths that receive the four phase shifted input clock signals P1, P2, P3 and P4, respectively, and output corresponding sampling clock signals in response, which make up the sampling strobe. Each of the aperture generation paths includes a signal splitter, a time delay circuit and an inverter, but no logic gate. In particular, a first aperture generation path 601 includes a first splitter 605 and a first path delay circuit 621 with inverted output, a second aperture generation path 602 includes a second splitter 606 and a second path delay circuit 622 with inverted output, a third aperture generation path 603 includes a third splitter 607 and a third path delay circuit 623 with inverted output, and a fourth aperture generation path 604 includes a fourth splitter 608 and a fourth path delay circuit 624 with inverted output. Alternatively, each of the first through fourth aperture generation paths 601-604 may include separate inverters following first through fourth path delay circuits 621-624 without inverted outputs. Each of the first through fourth splitters 605-608 splits a corresponding one of the phase shifted input clock signals P1-P4. Each of the first through fourth path delay circuits 621-624 is configured to delay one of the split input clock signals of the corresponding phase shifted input clock signal P1-P4 by a delay amount, where the length of the delay is set equal to a desired sampling aperture of a corresponding one of the interleaved samplers, as discussed above. Therefore, the aperture generation circuit 620 outputs undelayed and delayed split input clock signals corresponding to the phase shifted input clock signal P1-P4 as pairs of sampling clock signals from the first through fourth aperture generation paths 601-604, respectively.

In the depicted embodiment, the input signal sampling circuit 630 includes four interleaved samplers, connected in parallel, that receive the pairs of sampling clock signals output by the first through fourth aperture generation paths 601-604, respectively. The pairs of sampling clock signals control sampling of the input signal by the interleaved samplers, wherein the input signal may be a current signal. Each of the interleaved samplers includes a pair of switches and an integrator configured to integrate the input signal over the duration of each sampling aperture, under control of the pair of switches, to capture a corresponding sampling voltage. In particular, a first interleaved sampler 641 includes first switches 631a and 631b connected in series and a first integrator 635, a second interleaved sampler 642 includes second switches 632a and 632b connected in series and a second integrator 636, a third interleaved sampler 643 includes third switches 633a and 633b connected in series and a third integrator 637, and a fourth interleaved sampler 644 includes fourth switches 634a and 634b connected in series and a fourth integrator 638.

The first switch 631a receives the undelayed split input clock signal, and the first switch 631b receives the inverted, delayed split input clock signal output by the first aperture generation path 601. Accordingly, the first switch 631a activates during each sampling pulse of the undelayed split input clock signal, and the first switch 631b activates during times other than each sampling pulse of the delayed split input clock signal. The first integrator 635 performs integration of the input signal only when both of the first switches 631a and 631b are activated, which occurs during the delay period between the undelayed and delayed phase shifted input clock signals. In this manner, the rising and falling edges of each sampling pulse of the sampling clock signal controlling the first integrator 635 originate from the same edge of the phase shifted input clock signal, and has a desired pulse width equal to the length of the delay. In other words, a start and a stop of each sampling aperture originate from the same edge of the phase shifted input clock signal The other pairs of second through fourth switches 632a/632b, 633a/633b, and 634a/634b are controlled in the same way by the corresponding undelayed and delayed/inverted phase shifted input clock signals.

Figure 7:
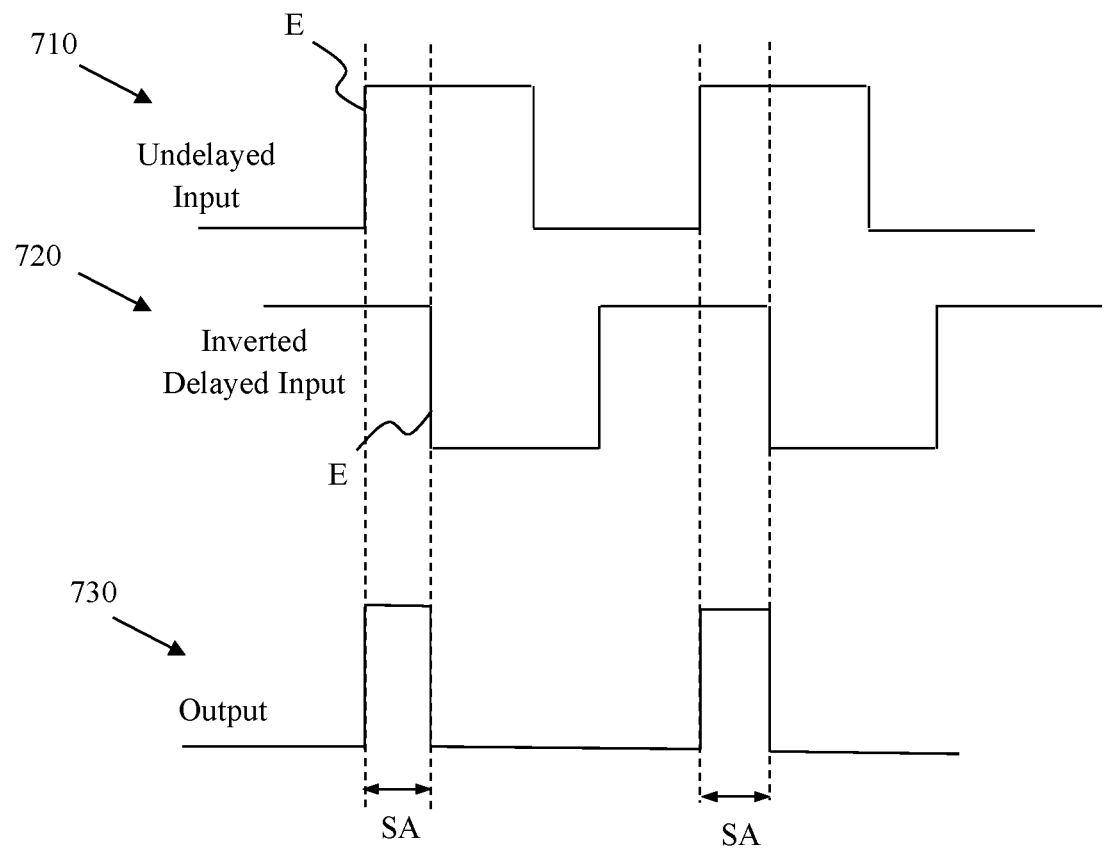
FIG. 7 is a logic diagram showing inputs and a combined output of switches in a sampling circuit, according to a representative embodiment.

FIG. 7 is a logic diagram showing inputs and a combined output of switches in a sampling circuit, according to a representative embodiment. Referring to FIG. 7, the waveform 710 shows the undelayed split input clock signal provided to the first switch 631a of the first interleaved sampler 641, for example, and the waveform 720 shows the delayed and inverted split input clock signal (output by the first path delay circuit 621) provided to the first switch 631b of the first interleaved sampler 641. The waveform 730 shows the combined output by the first switches 631a and 631b in response to the undelayed and delay/inverted inputs.

As shown, edge E of the delayed and inverted split input clock signal is delayed from the same edge E of the undelayed split input clock signal by the desired sampling aperture SA. During this delay time, both of the first switches 631*a* and 631*b* are activated, thereby resulting in an integration time equal to the sampling aperture SA. The pair of second switches 632*a*/632*b*, the pair of third switches 633*a*/633*b*, and the pair of fourth switches 634*a*/634*b* function in the same manner.

Figure 8:
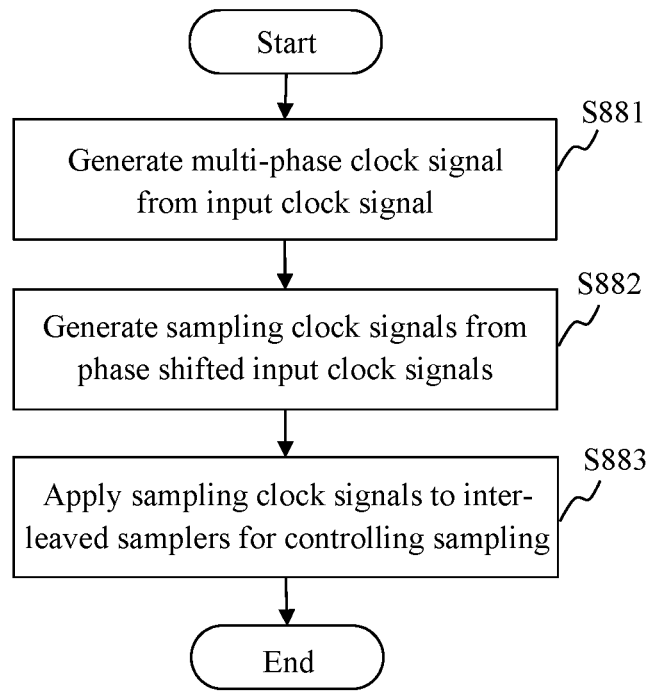
FIG. 8 is a flow diagram of a method of generating a sampling strobe for sampling an input signal, according to a representative embodiment.

FIG. 8 is a flow diagram of a method of generating a sampling strobe for sampling an input signal, according to a representative embodiment.

Referring to FIG. 8, a multi-phase clock signal is generated from an input clock in block S881. The multi-phase clock signal includes multiple phase shifted input clock signals. The multi-phase clock signal may be generated from the input clock by applying time delays to the input clock to provide the phase shifted input clock signals. When the input clock is a differential input clock, the input clock comprises a positive input clock and a negative input clock having an opposite polarity. For example, the positive input clock may provide 0 phase shift and be delayed to provide 90 degrees phase shift, and the negative input clock may provide 180 phase shift and be delayed to provide 270 degrees phase shift. The multi-phase clock signal thereby provides phase shifted input clock signals at 0 degrees, 90 degrees, 180 degrees, and 270 degrees. Alternatively, the multi-phase clock signal may be generated from the input clock by dividing down the input clock from a higher frequency to provide the phase shifted input clock signals.

In block S882, multiple sampling clock signals are generated from the multiple phase shifted input clock signals. Generating the sampling clock signals includes adjusting duty cycles of the phase shifted input clock signals, respectively, to provide sampling pulses having desired pulse widths. For each sampling clock signal of the multiple sampling clock signals, a rising edge and a falling edge of each sampling pulse originate from the same input edge of the input clock. For example, the rising edge of each sampling pulse may be defined by an input edge of the input clock and the falling edge of each sampling pulse is defined by a delayed version of the same input edge of the input clock.

In block S883, the multiple sampling clock signals are applied to multiple interleaved samplers, respectively, for controlling sampling of the input signal according to the desired pulse widths of the sample pulses. The desired pulse widths correspond to sampling apertures, which are windows of time for each interleaved sampler to integrate the input signal to capture a sampled voltage. In an embodiment, the interleaved samplers may include transistors connected in parallel for receiving the input signal, such as FETs or BJTs, for example. In this case, applying the sampling clock signals to the interleaved samplers includes applying the sampling pulses to gates of the FETs or bases of the BJTs for selectively activating the transistors according to the desired pulse widths of the sampling pulses.

While the disclosure has been illustrated and described in detail in the drawings and foregoing description, such illustration and description are to be considered illustrative or exemplary and not restrictive; the disclosure is not limited to the disclosed embodiments. Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

The illustrations of the embodiments described herein are intended to provide a general understanding of the structure of the various embodiments. The illustrations are not intended to serve as a complete description of all of the elements and features of the disclosure described herein. Many other embodiments may be apparent to those skilled in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

The Abstract of the Disclosure is provided to comply with 37 C.F.R. § 1.72 (b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

Aspects of the present disclosure may be embodied as an apparatus, method or computer program product. Accordingly, aspects of the present invention may take the form of an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method of generating a sampling strobe for sampling an input signal, the method comprising:

generating a multi-phase clock signal from an input clock, wherein the multi-phase clock signal comprises a plurality of phase shifted input clock signals;

generating a plurality of sampling clock signals from the plurality of phase shifted input clock signals by adjusting duty cycles of the plurality of phase shifted input clock signals, respectively, to provide sampling pulses having desired pulse widths, wherein for each sampling clock signal of the plurality of sampling clock signals, a rising edge and a falling edge of each sampling pulse originate from the same input edge of the input clock; and applying the plurality of sampling clock signals to a plurality of interleaved samplers, respectively, for controlling sampling of the input signal according to the desired pulse widths of the sampling pulses, wherein the desired pulse widths correspond to sampling apertures.

2. The method of claim 1, wherein the rising edge of each sampling pulse is defined by the input edge of the input clock and the falling edge of each sampling pulse is defined by a delayed version of the same input edge of the input clock.

3. The method of claim 1, wherein generating the multi-phase clock signal from the input clock comprises applying a plurality of time delays to the input clock to provide the plurality of phase shifted input clock signals.

4. The method of claim 1, wherein generating the multi-phase clock signal from the input clock comprises dividing down the input clock from a higher frequency to provide the plurality of phase shifted input clock signals.

5. The method of claim 1, wherein the plurality of interleaved samplers comprise a plurality of transistors connected in parallel for receiving the input signal, and
wherein applying the plurality of sampling clock signals to the plurality of interleaved samplers comprises applying the sampling pulses to gates or bases of the plurality of transistors for selectively activating the plurality of transistors according to the desired pulse widths of the sampling pulses.

6. The method of claim 1, wherein the input signal is a current signal.

7. The method of claim 1, wherein the desired pulse widths of the sampling pulses are approximately equal to phase shifts of the plurality of phase shifted input clock signals in the multi-phase clock signal.

8. A device for generating a sampling strobe for controlling a sampling device to sample an input signal, the device comprising:
a phase shifter configured to phase shift an input clock to provide a multi-phase clock signal comprising a plurality of phase shifted input clock signals; and
an aperture generating circuit configured to:
generate a plurality of sampling clock signals from the plurality of phase shifted input clock signals, respectively, by adjusting duty cycles of the plurality of phase shifted input clock signals to provide sampling pulses having desired pulse widths, wherein for each sampling clock signal of the plurality of sampling clock signals, a rising edge and a falling edge of each sampling pulse originate from the same input edge of the input clock; and
apply the plurality of sampling clock signals to a plurality of interleaved samplers of the sampling device, respectively, for controlling sampling of the input signal by integrating according to the desired pulse widths of the sampling pulses, wherein the desired pulse widths correspond to sampling apertures.

9. The device of claim 8, wherein the aperture generating circuit comprises a plurality of aperture generating paths configured to receive the plurality of phase shifted input clock signals, respectively, wherein each aperture generating path comprises:
a splitter configured to split the respective phase shifted input clock signal into split clock signals;
a path delay circuit configured to delay one of the split clock signals by path delay equal to the sampling aperture, thereby providing a delayed split clock signal in addition to a non-delayed split clock signal; and
a logic gate configured to provide the sampling pulses having the desired pulse width equal to the path delay based on the delayed and non-delayed split input clock signals.

10. The device of claim 9, wherein the logic gate of each aperture generating path comprises an AND logic gate with an input for receiving the non-delayed split input clock signals and an inverted input for receiving the delayed split input clock signals of the phase shifted input clock signal.

11. The device of claim 8, wherein the input clock comprises a differential input clock comprising a positive input clock and a negative input clock having opposite polarities, and
wherein the phase shifter comprises:
a first time delay circuit configured to delay the positive input clock by a phase delay to output a delayed first input clock signal having a different phase than the positive input clock; and
a second time delay circuit configured to delay the negative input clock by the phase delay to output a delayed second input clock signal having a different phase than the negative input clock,
wherein the aperture generating circuit generates the plurality of sampling clock signals based on the positive and negative input clocks and the delayed first and second input clock signals, respectively.

12. The device of claim 11, wherein the phase delay of each of the first time delay circuit and the second time delay circuit are controlled by a delay locked loop (DLL).

13. The device of claim 8, wherein the phase shifter comprises:
a clock divider configured to divide down the input clock from a higher frequency of the input clock to provide the plurality of phase shifted input clock signals having different phases.

14. The device of claim 8, wherein the plurality of interleaved samplers of the sampling device comprise:
a plurality of switches connected in parallel and configured to selectively receive the input signal when activated; and
a plurality of integrators connected to the plurality of switches and configured to integrate the input signal received via the plurality of switches when activated to provide sampling voltages, respectively.

15. The device of claim 14, wherein the plurality of switches comprise a plurality of transistors connected in parallel for selectively receiving the input signal, and
wherein the plurality of sampling clock signals from the aperture generating circuit are connected to gates or bases of the plurality of transistors, respectively, for selectively activating the plurality of transistors.

16. The device of claim 14, wherein the plurality of integrators comprise a plurality of capacitors connected to the plurality of switches, respectively.

17. A device for generating a sampling strobe for controlling a sampling device to sample an input signal, the device comprising:
- a phase shifter configured to phase shift an input clock to provide a multi-phase clock signal comprising a plurality of phase shifted input clock signals; and
- a plurality of aperture generating paths configured to generate a plurality of sampling clock signals from the plurality of phase shifted input clock signals, respectively, to be applied to a plurality of interleaved samplers of an input signal sampling circuit for controlling sampling of the input signal, wherein each aperture generating path comprises:
  - a splitter configured to split the respective phase shifted input clock signal into split input clock signals; and
  - a path delay circuit configured to delay and invert one of the split input clock signals by a path delay, thereby providing a delayed and inverted split input clock signal in addition to a non-delayed split input clock signal,
- wherein the plurality of interleaved samplers comprise a plurality of switch pairs connected in parallel for receiving the input signal, and each switch pair comprises a first switch connected in series with a second switch,
- wherein the first switch of each switch pair is controlled by the non-delayed split input clock signal from a corresponding aperture generating path, and the second switch of each switch pair is controlled by the delayed and inverted split input clock signal from the corresponding aperture generating path,
- wherein for each interleaved sampler, a sampling aperture for the sampling of the input signal is defined as a duration of when both the first switch and the second switch are on in response to the non-delayed and delayed split input clock signals, such that a start and a stop of each sampling aperture originate from the same input edge of the phase shifted input clock signal, and
- wherein the duration of when both the first switch and the second switch are on is equal to the path delay.

18. The device of claim 17, wherein the input clock comprises a differential input clock comprising a positive input clock and a negative input clock having opposite polarities, and
wherein the phase shifter comprises:
- a first time delay circuit configured to delay the positive input clock by a phase delay to output a delayed first input clock signal having a different phase than the positive input clock; and
- a second time delay circuit configured to delay the negative input clock by the phase delay to output a delayed second input clock signal having a different phase than the negative input clock,
wherein the plurality of aperture generating paths generate the plurality of sampling clock signals based on the positive and negative input clocks and the delayed first and second input clock signals, respectively.

19. The device of claim 18, wherein the phase delay of each of the first time delay circuit and the second time delay circuit are controlled by a delay locked loop (DLL).

20. The device of claim 17, wherein the phase shifter comprises:
- a clock divider configured to divide down the input clock from a higher frequency of the input clock to provide the plurality of phase shifted input clock signals having different phases.

\* \* \* \* \*